United States Patent
Crosland et al.

(10) Patent No.: US 8,607,105 B1
(45) Date of Patent: Dec. 10, 2013

(54) MEMORY TEST CIRCUIT AND MEMORY TEST TECHNIQUES

(75) Inventors: Andrew Crosland, Aylesbury (GB); Adam Titley, Warfield (GB)

(73) Assignee: Altera Corporation, San Jose, CA (US)

(*) Notice: Subject to any disclaimer, the term of this patent is extended or adjusted under 35 U.S.C. 154(b) by 639 days.

(21) Appl. No.: 12/762,965

(22) Filed: Apr. 19, 2010

(51) Int. Cl.
*G11C 29/00* (2006.01)

(52) U.S. Cl.
USPC .......................................................... 714/718

(58) Field of Classification Search
USPC .......... 714/718, 723, 710, 719, 763; 711/170, 711/200, 202
See application file for complete search history.

(56) References Cited

U.S. PATENT DOCUMENTS

| | | | | |
|---|---|---|---|---|
| 4,333,143 A * | 6/1982 | Calder | ............................. | 710/53 |
| 5,624,316 A * | 4/1997 | Roskowski et al. | ............. | 463/45 |
| 5,696,924 A * | 12/1997 | Robertson et al. | ............ | 711/202 |
| 6,084,880 A * | 7/2000 | Bailey et al. | ............... | 370/395.2 |
| 6,484,271 B1 * | 11/2002 | Gray | ............................... | 714/6.1 |
| 6,525,985 B2 * | 2/2003 | Mizuno et al. | ............ | 365/230.03 |
| 6,738,887 B2 * | 5/2004 | Colpo et al. | .................... | 711/202 |
| 7,337,360 B2 * | 2/2008 | Shen et al. | ....................... | 714/20 |
| 7,346,755 B2 * | 3/2008 | Pomaranski et al. | .......... | 711/202 |
| 7,552,319 B2 * | 6/2009 | Matheny | ............................. | 713/1 |
| 8,060,798 B2 * | 11/2011 | Roohparvar et al. | .......... | 714/710 |
| 2007/0277055 A1 * | 11/2007 | Shen et al. | .......................... | 714/5 |
| 2009/0006782 A1 * | 1/2009 | Buchmann et al. | ............ | 711/154 |

* cited by examiner

*Primary Examiner* — Phung M Chung
(74) *Attorney, Agent, or Firm* — Womble Carlyle Sandridge & Rice LLP

(57) ABSTRACT

Techniques and circuits for testing a memory are provided. The techniques include disabling a plurality of interrupts to an integrated circuit (IC). Contents of a first memory region to be tested are copied to a second memory region. The second memory region where the contents are copied to is a safe memory region that will not be affected by the memory test. Memory accesses are mapped to the second memory region so that memory accesses that are associated with the first memory region are mapped to the second memory region. The plurality of interrupts is re-enabled after the memory contents in the first memory region are copied and remapped to the second memory region. Memory accesses due to the interrupts are redirected from the first memory region to the second memory region according to the memory mapping. The first memory region is tested with a test circuit of the IC.

20 Claims, 6 Drawing Sheets

MEMORY TEST CIRCUIT AND MEMORY TEST TECHNIQUES

BACKGROUND

Memory tests are generally carried out to ensure that memory modules used in a system are functioning correctly. In safety critical applications, for instance, it is necessary to ensure that memory structures in the application do not suffer from faults. Industrial designs and safety systems usually require continuous non-destructive testing of memory used by the application to ensure that the systems function as expected.

Testing in software applications typically requires careful scheduling as memory contents could be changed by the application or the application could read test pattern data instead of required data. In other words, memory testing may be destructive and application data must be saved before the test is performed. However, because the application data is saved, the application cannot access required data and is stalled for the duration of the memory test.

Generally speaking, in a software system, software interrupts have to be disabled when memory modules in the system are being tested. For example, in a typical software memory test, contents of the memory region to be tested need to be copied and saved before the memory region is tested. Generally, software interrupts are disabled for the whole duration of the test which includes, making a copy of the memory region to be tested, testing the memory region, and restoring the contents of the memory from the safe copy. Interrupts are only re-enabled after the test is completed and the contents of the memory are restored. Consequently, the application is stalled for the whole duration of the memory test as the processor is tied up running the test.

Therefore, it is desirable to be able to perform memory tests without having to stall the application for the whole duration of the test. It is also desirable to be able to accelerate the process and free up the processor from exhaustive memory tests.

It is within this context that the invention arises.

SUMMARY

Embodiments of the present invention include methods and circuits for testing a memory.

It should be appreciated that the present invention can be implemented in numerous ways, such as a process an apparatus, a system, a device or a method on a computer readable medium. Several inventive embodiments of the present invention are described below.

In one embodiment, a method of testing a memory is disclosed. The method includes disabling a plurality of interrupts to an integrated circuit (IC). Contents in a first memory region are copied to a second memory region after interrupts have been disabled. Memory accesses associated with the first memory region are mapped to the second memory region. Interrupts are enabled after the mapping. Memory accesses due to the interrupts are redirected from the first memory region to the second memory region based on the mapping. The first memory region is then tested using a test circuit on the IC.

In another embodiment, a test circuit is provided. The test circuit includes a register block coupled to a bus structure that is in communication with an application processor. The register block enables access and control to the test circuit. A control logic block is coupled to the register block. An algorithm block that is used for testing a memory module coupled to the test circuit is coupled to the control logic block. The control logic block sets and resets the algorithm block accordingly. The control logic block is also coupled to a memory addressing block where phases in the memory addressing block are initiated by the control logic block. A bridge circuit block is coupled to the memory addressing block, the algorithm block and the bus structure. The bridge circuit block operates as an address translator when the test circuit is performing a memory test operation.

In yet another embodiment in accordance with the present invention, a method of performing a memory test with an IC is provided. The method begins by reading contents from an address on a first memory. The contents are then written to an address on a second memory. A position of a pointer is incremented to a next address on the first and second memories. The first memory is tested using a test circuit of the IC after the contents are written to the second memory. Read memory accesses from the first memory are redirected to the second memory based on the position of the pointer.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

DETAILED DESCRIPTION

The following embodiments describe methods and circuits for testing a memory.

It will be obvious, however, to one skilled in the art, that the present invention may be practiced without some or all of these specific details. In other instances, well-known operations have not been described in detail in order not to unnecessarily obscure the present invention.

The embodiments described herein provide techniques to test a memory. One embodiment describes a method for testing a memory module without stalling a run-time application. The contents of the memory module are copied to a temporary memory location, e.g., a cache memory or a designated secondary memory region, before the memory module is tested.

The application can access its data from the temporary memory location and continue to run while the application memory is being tested. In other words, the method allows the application to continue running even when a test operation is performed on the memory module. Another embodiment describes a test circuit that is used to test a memory module. Typically, memory tests are performed by the system central processing unit (CPU) and these tests, even though necessary, consume valuable CPU bandwidth. The test circuit described in one of the embodiments below implements various test algorithms and performs different tests on the memory. Therefore, memory test overhead is removed from the system processor and any overhead associated with the test operation can be substantially reduced with the test circuit described in one embodiment.

Figure 1A:
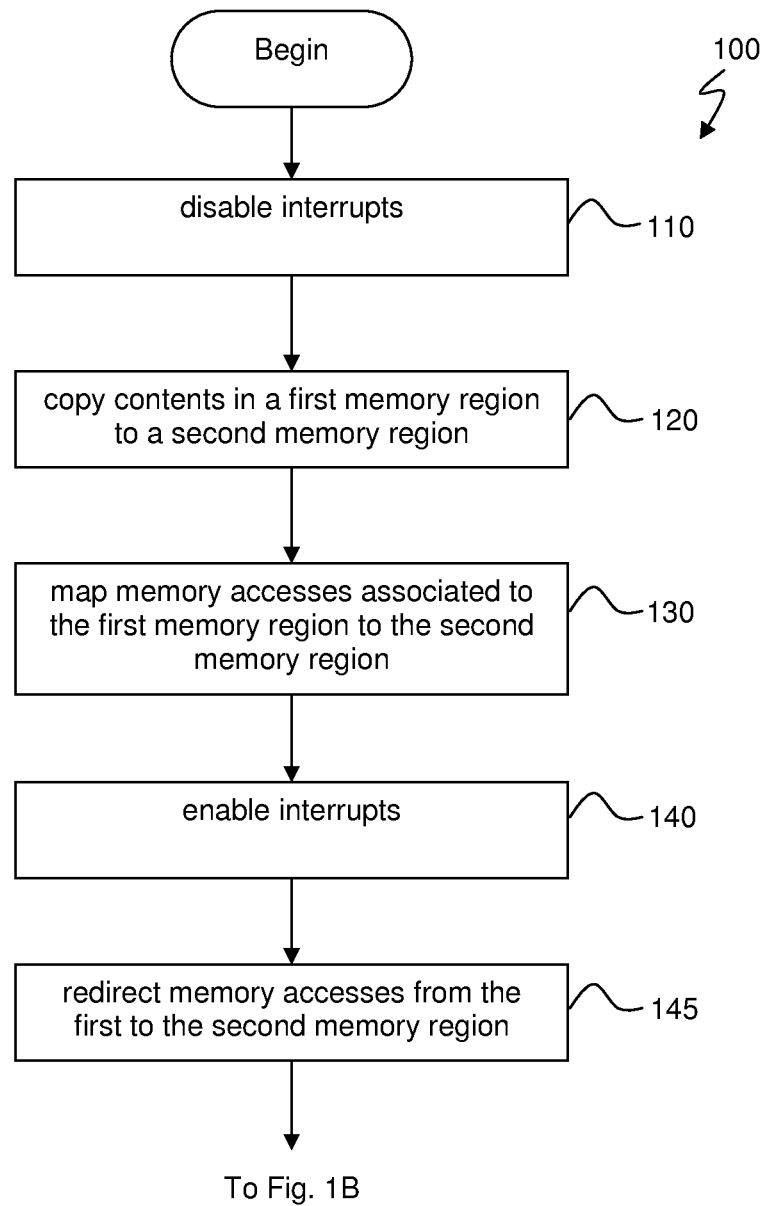
FIGS. 1A and 1B, meant to be illustrative and not limiting, show a simplified method flow for testing a memory module as one embodiment in accordance with the present invention.
Figure 1B:
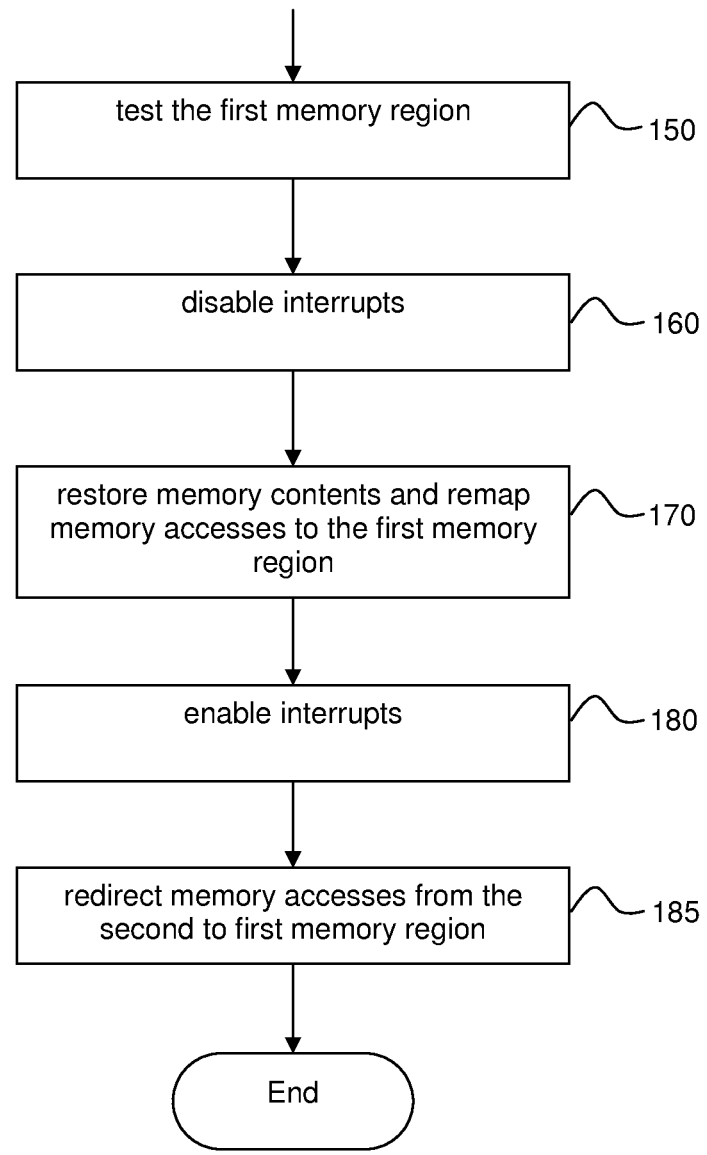

FIGS. 1A and 1B, meant to be illustrative and not limiting, show simplified method flow 100 for testing a memory module as one embodiment in accordance with the present invention. Flow 100 starts with a plurality of interrupts to an integrated circuit (IC) being disabled in operation 110. It should be appreciated that interrupts as described herein refer to signals that are used to indicate to an application or a circuit that an event has occurred. A specified action is usually needed from the application or the circuit in the event of an interrupt. In an exemplary embodiment, when interrupts are disabled in operation 110, any application that might be running is stalled or suspended.

Referring still to FIG. 1A, contents in a first memory region are copied to a second memory region in operation 120. In one embodiment, the second memory region is a designated temporary memory region, e.g., a cache memory or a scratch pad type memory, that is smaller in size compared to the first memory region. In another embodiment, the second memory region is an embedded memory module in a programmable logic device (PLD). After the contents of the first memory region is copied to the second memory region, memory accesses associated with the first memory region is mapped to the second memory region in operation 130. Interrupts are enabled in operation 140. In one embodiment, when the interrupts are enabled, any runtime application that has been stalled when the interrupts were disabled in operation 110 is resumed when the interrupts are enabled in operation 140. In operation 145, memory accesses due to interrupts to the IC are redirected from the first memory region to the second memory region according to the mapping in operation 130. In other words, application accesses that are intended for the first memory region are routed to the second memory region.

Continuing from FIG. 1A, the first memory region is tested by a test circuit of the IC in operation 150 of FIG. 1B. In one embodiment, the test circuit is similar to the test circuit in the embodiment of FIG. 5, details of which will be described in subsequent paragraphs. The test may include a variety of memory standard and non-standard memory tests, e.g., March test, walkpath test, galpat test, etc. While the memory is being tested in operation 150, applications can be run normally as data required for any runtime application can be accessed from the second memory region. Interrupts to the IC are disabled in operation 160 after the first memory region has been tested. Memory contents in the second memory region are restored and memory accesses are remapped to the first memory region in operation 170. Interrupts are enabled in operation 180 after the memory contents have been restored. Memory accesses are redirected from the second memory region back to the first memory region in operation 185.

Figure 2:
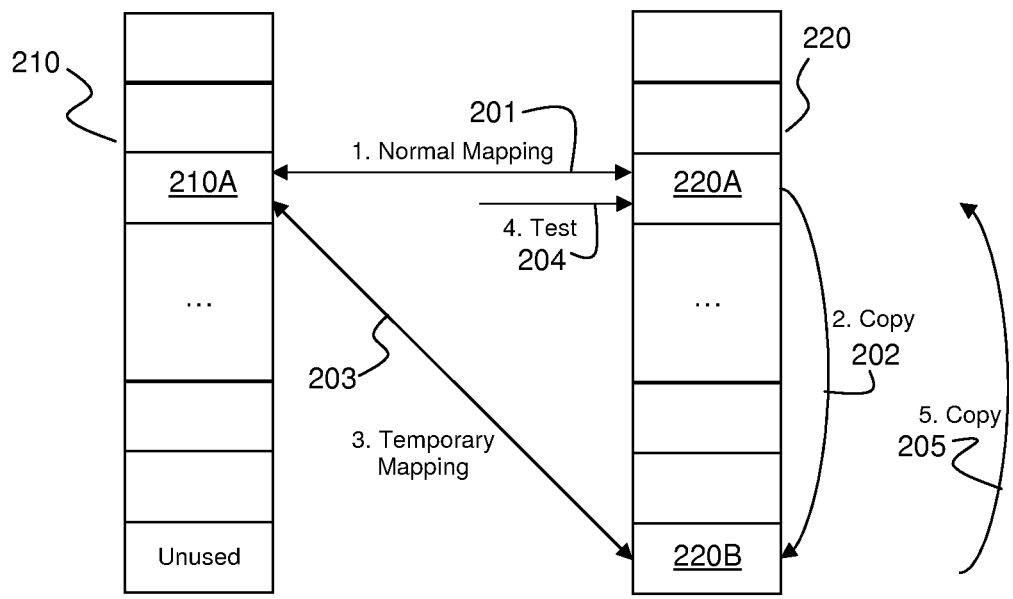
FIG. 2, meant to be illustrative and not limiting, shows how the contents of one memory region is copied and mapped to another memory region, as one embodiment in accordance with the present invention.

FIG. 2, meant to be illustrative and not limiting, shows how the contents of one memory region is copied and mapped to another memory region, as one embodiment in accordance with the present invention. Application memory space 210 and physical memory space 220 are broken down into blocks of the same size, commonly referred to as pages. In the embodiment of FIG. 2, page 210A in application memory space 210 is mapped to page 220A in physical memory space 220. When page 220A needs to be tested, contents in page 220A are copied to another region in physical memory space 220, in this instance, page 220B. Memory accesses to page 220A are then mapped to page 220B. Page 220A is tested after the contents in that page are copied and mapped to page 220B. While page 220A is being tested, data in page 220B can still be accessed by the runtime application. In one embodiment, a hardware test circuit is used to test the memory page. After page 220A has been tested, the memory contents are restored to page 220A, i.e., memory contents in page 220B are copied back to page 220A. The original memory mapping is restored to page 220A.

Figure 3A:
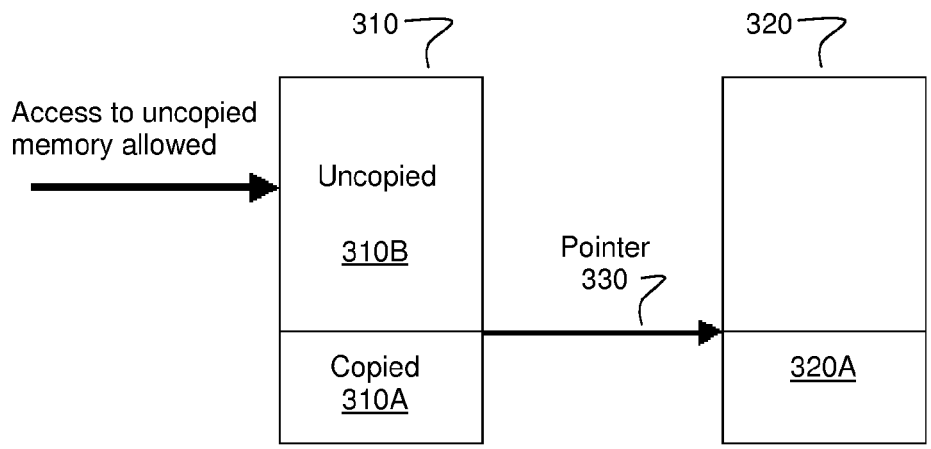
FIGS. 3A and 3B, meant to be illustrative and not limiting, show access to one memory region mapped to another memory region according to the position of an address pointer, as one embodiment in accordance with the present invention.
Figure 3B:
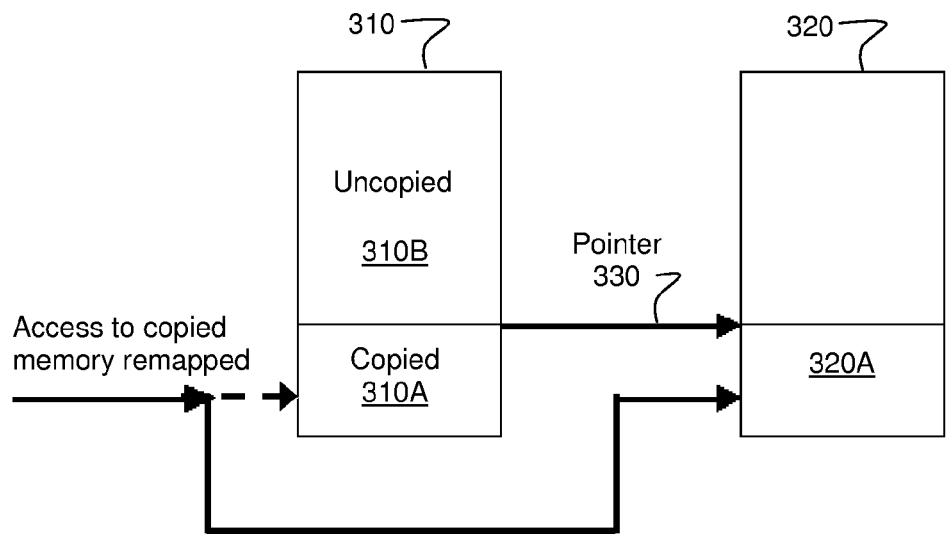

FIGS. 3A and 3B, meant to be illustrative and not limiting, show access to memory region 310 mapped to memory region 320 according to the position of address pointer 330, as one embodiment in accordance with the present invention. In the embodiment of FIG. 3A, contents in space 310A are marked as copied to space 320A of memory region 320 based on the position of address pointer 330. Contents in space 310B in memory region 310 have not been copied. In the embodiment of FIG. 3A, access to memory space 310B in memory region 310 is allowed because the contents in memory space 310B have not been copied to memory region 320. In this embodiment, access to memory space 310B in memory region 310 is not mapped to memory region 320 as the contents in memory space 310B have not been copied to memory region 320, based on the position of address pointer 330.

In the embodiment of FIG. 3B, when memory space 310A is accessed, the memory access is remapped to memory space 320A. The position of address pointer 330 indicates that memory space 310A in memory region 310 has been copied to memory space 320A in memory region 320. In one embodiment, the position of address pointer 330 is determined by a direct memory addressing (DMA) function. The DMA function keeps track of the position of address pointer 330. In the embodiment of FIGS. 3A and 3B, address pointer 330 starts from the bottom of memory stacks 310 and 320. When a page or a memory space in memory region 310 is copied to memory region 320, the position of address pointer 330 is incremented. It should be appreciated that the position of the memory pointer may start at the top of the memory stack and the position of pointer can be decremented as the pointer moves to the bottom of the memory stack.

In the embodiments of FIGS. 3A and 3B, interrupts or processor accesses to memory do not have to be disabled or stalled. Address pointer 330 of the DMA function is monitored to determine which memory locations have been copied. If the processor attempts to access an already copied location, then the access is remapped to the copy location. All other accesses are allowed to access the original memory location. In one embodiment, the contents of memory region 320 are restored to memory region 310. In this embodiment, when the processor attempts to access an unrestored location in memory region 310, the memory access is remapped to memory region 320. In the embodiment of FIGS. 3A and 3B, interrupts may remain enabled at all times and the processor or application does not need to be stalled except when the processor attempts to access a memory location that is in the process of being copied from one memory region to another.

Figure 4:
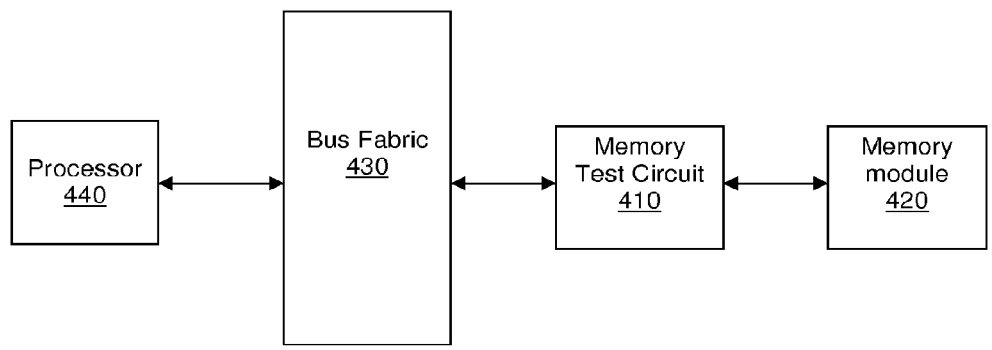
FIG. 4, meant to be illustrative and not limiting, shows a memory test circuit coupled to a memory module and a bus fabric, as one embodiment in accordance with the present invention.

FIG. 4, meant to be illustrative and not limiting, shows memory test circuit 410 coupled to memory module 420 and bus fabric 430, as one embodiment in accordance with the present invention. It should be appreciated that memory test circuit 410 and bus fabric 430 may be blocks embedded within an IC device. Bus fabric 430 connects memory test circuit 410 to application processor 440. It should be appreciated that application processor 440 may be an embedded processor on the IC device that runs and carries out instructions of an application on the IC. Bus fabric 430 is an interface that connects memory test circuit 410 with application processor 440 and allows accesses to memory module 420 when other bus masters may be accessing the memory. Memory test circuit 410 tests memory module 420 by running different test algorithms. Memory module 420 may be an embedded random access memory (RAM) block on the IC device or an external memory module.

Figure 5:
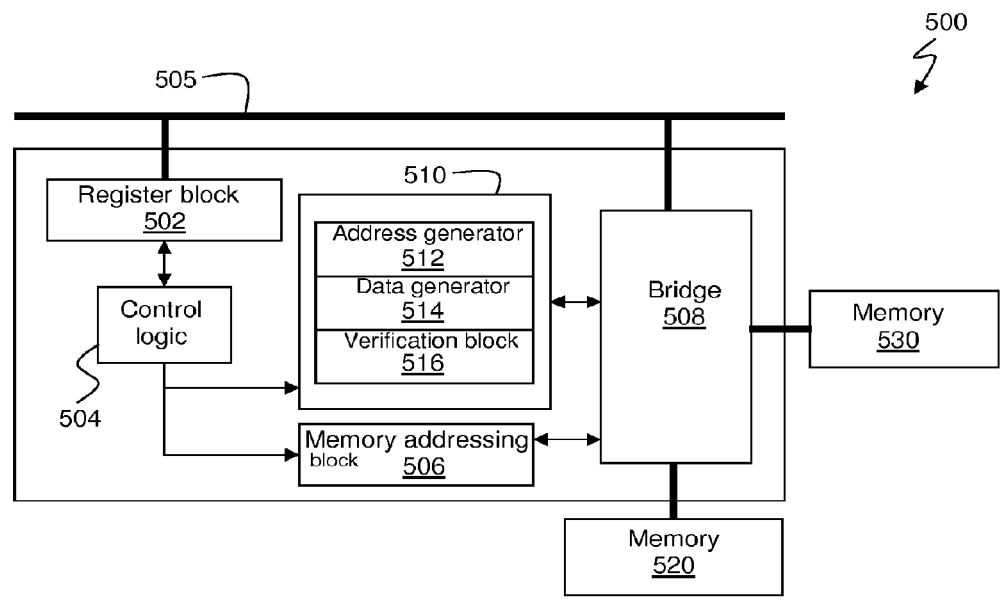
FIG. 5, meant to be illustrative and not limiting, shows a memory test structure as one embodiment in accordance with the present invention.

FIG. 5, meant to be illustrative and not limiting, shows memory test structure 500 as one embodiment in accordance with the present invention. Memory test structure 500 is connected to bus structure 505. Bus structure 505 is coupled to register block 502 that enables access and control to memory test structure 500. In one embodiment, bus structure 505 is a system bus that connects to another IC, e.g., an application processor or a central processing unit (CPU), and allows the other IC or application processor to read and write to registers within memory test structure 500 through register block 502. In an exemplary embodiment, register block 502 allows the application processor to control the function of memory test structure 500 and read back results or progress of an ongoing memory test.

Referring still to FIG. 5, control logic block 504 is coupled to register block 502. In one embodiment, control logic block 504 is a finite state machine (FSM) block that handles the synchronization of various phases in a memory test. Control logic block 504 is coupled to algorithm block 510 and memory addressing block 506. In one embodiment, control logic block 504 resets algorithm block 510 and initiates different phases in memory addressing block 506 during a memory test operation.

In the embodiment of FIG. 5, algorithm block 510 includes address generator 512, data generator 514 and verification block 516. Address generator 512 generates a plurality of memory addresses within a test region on a memory block under test. In one embodiment, address generator 512 includes an up/down counter to cycle test data through all addresses within the test area. In such an embodiment, the final address of the test region is a combination of the counter value and an address offset. Data generator 514 generates the correct data value for each cycle of the memory test. For example, data generator 514 may generate relatively simple data patterns, e.g., a single bit set in a word of zeroes, for the memory test. Verification block 516 checks the test area memory read value against the expected value. In the embodiment of FIG. 5, verification block 516 compares the data value generated by data generator 514 with the data written to memory 520.

Referring still to FIG. 5, memory addressing block 506 is also coupled to control logic block 504. In one embodiment, memory addressing block 506 is used to perform a block copy of data between memory 520 and memory 530. In the embodiment of FIG. 5, memory 520 is a primary memory under test and memory 530 is a secondary memory. In one phase during a memory test operation, contents of test area of primary memory 520 are copied to secondary memory 530. In another phase, contents of secondary memory 530 are copied back into the test area of primary memory 520. In one embodiment, memory addressing block 506 reads data from one memory address and writes the data to another memory address. After each read/write operation, the addresses in the memory modules are incremented using a counter.

Referring still to FIG. 5, bridge circuit block 508 is coupled to memory addressing block 506 and algorithm block 510. Bridge circuit block 508 is a bridge between bus structure 505 and memory modules 520 and 530. In one embodiment, during a memory test operation, access requests to the test area of primary memory 520 are intercepted and forwarded to secondary memory 530 by bridge circuit block 508. In an exemplary embodiment, the memory address of an access request is compared to check if the access request is intended for the test area of memory 520. If the access request is intended for the test area of memory 520, the access request is routed to secondary memory 530 by bridge circuit block 508. It should be appreciated that, memory test structure may be a reusable logic block or an intellectual property (IP) core on an IC, such as a programmable logic device.

Figure 6:
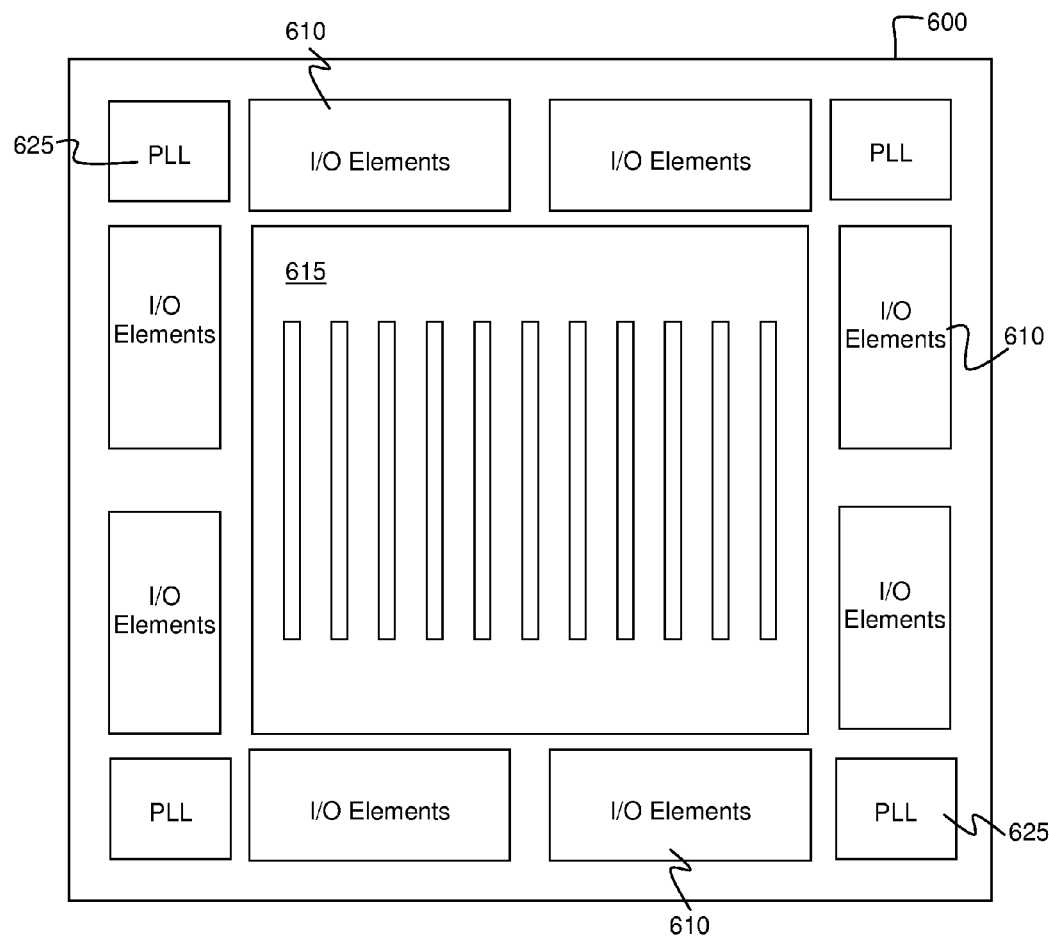
FIG. 6, meant to be illustrative and not limiting, shows a simplified block diagram of a programmable logic device (PLD) that can include aspects of the present invention.

FIG. 6, meant to be illustrative and not limiting, shows a simplified block diagram of PLD 600 that can include aspects of the present invention. Programmable device 600 includes logic region 615 and I/O elements 610. I/O elements 610 may support a variety of memory interfaces. Other auxiliary circuits such as phase-locked loops (PLLs) 625 for clock generation and timing, can be located outside the core logic region 615, e.g., at corners of programmable device 600 and adjacent to I/O elements 610.

Referring still to FIG. 6, logic region 615 may be populated with logic cells which include, among other things, at the most basic level, "logic elements" (LEs). LEs may include look-up table-based logic regions and these logic elements may be grouped into "Logic Array Blocks" (LABs). The logic elements and groups of logic elements or LABs can be configured to perform logical functions desired by the user. Logic region 615 may also include a plurality of embedded memory blocks and logic blocks that are configured as an IP core that contains a memory test structure, such as memory test structure 500 shown in the embodiment of FIG. 5. A CPU external to PLD 600 of FIG. 6 may communicate with the memory test structure of FIG. 5.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of testing a memory, comprising:
    disabling a plurality of interrupts to an integrated circuit (IC);
    copying contents of a first memory region to a second memory region, the first and second memory regions accessible to the IC due to disabling the plurality of interrupts;
    mapping memory accesses to the second memory region, wherein memory accesses associated with the first memory region are mapped to the second memory region;
    enabling the plurality of interrupts due to the mapping;
    redirecting memory accesses due to the enabling of the plurality of interrupts, from the first memory region to the second memory region according to the mapping; and
    testing the first memory region through a test circuit due to the redirecting the memory accesses.

2. The method of claim 1, further comprising:
    disabling the plurality of interrupts to the IC after the testing;
    copying the contents from the second memory region to the first memory region due to the disabling the plurality of interrupts after the testing;
    enabling the plurality of interrupts due to the copying; and
    redirecting memory accesses due to the enabling the plurality of interrupts, from the second memory region to the first memory region, wherein the redirecting is performed through the test circuit and the test circuit is external to the IC.

3. The method of claim 2, further comprising:
    remapping the memory accesses to the first memory region after the copying from the second memory region to the first memory region.

4. The method of claim 1, wherein the redirecting is performed by a bridge circuit in the test circuit.

5. The method of claim 1, wherein the testing includes one of a static bit failure test, a crosstalk test or a dynamic coupling test.

6. The method of claim 1, wherein the disabling the plurality of interrupts stalls a runtime application and wherein the enabling the plurality of interrupts resumes the runtime application.

7. A test circuit, comprising:
    a register block enabling access and control to the test circuit, the register block coupled to a bus structure, wherein the bus structure is in communication with another integrated circuit (IC);
    a control logic block coupled to the register block;
    an algorithm block for testing a first memory coupled to the test circuit and the another IC, the algorithm block coupled to the control logic block, wherein the control logic block is capable of resetting the algorithm block;
    a memory addressing block coupled to the control logic block, wherein memory testing phases in the memory addressing block are initiated by the control logic block, and wherein the memory addressing block is configured to limit access to the first memory in preparation of a memory test operation on the first memory coupled to the test circuit; and
    a bridge circuit block coupled to the memory addressing block, the algorithm block and the bus structure, wherein the bridge circuit block is an address translator when the test circuit is performing the memory test operation.

8. The test circuit of claim 7, wherein the first memory is coupled to the bridge circuit block.

9. The test circuit of claim 7, further comprising:
    a second memory coupled to the test circuit, wherein the second memory is a temporary memory region when the test circuit is performing the memory test operation on the first memory, and wherein the another IC is an application processor.

10. The test circuit of claim 9, wherein the bridge circuit redirects memory accesses from the application processor when the test circuit is performing the memory test operation.

11. The test circuit of claim 9, wherein the first memory is a first memory region of one memory block and second memory is a second memory region of the one memory block.

12. The test circuit of claim 7, wherein the test circuit is integrated into a Programmable Logic Device (PLD).

13. The test circuit of claim 7, wherein the control logic block includes a finite state machine (FSM), wherein the FSM synchronizes the memory test phases and resets the algorithm block prior to the memory test.

14. The test circuit of claim 7, wherein the algorithm block comprises:
    an address generator that generates a plurality of memory addresses within a test region on a memory block;
    a data generator that generates a plurality of expected values during the memory test operation; and
    a verification block that compares a plurality of received values with the plurality of expected values.

15. A method of performing a memory test of an integrated circuit (IC), comprising:
    stalling memory accesses to a first memory in communication with the IC;
    reading contents from an address on first memory due to the stalling;
    writing the contents from the address on the first memory to an address on a second memory in communication with the IC;
    incrementing a position of a pointer to a next address on the first and second memories;
    testing the first memory using an external test circuit in communication with the IC; and
    redirecting read memory accesses originating from another IC from the first memory to the second memory based on the position of the pointer during the testing.

16. The method of claim 15, further comprising:
enabling the memory accesses after the writing the contents to the second memory.

17. The method of claim 15, wherein the reading and writing are performed by a memory addressing circuit in the IC.

18. The method of claim 15, further comprising:
determining the position of the pointer; and
redirecting write memory accesses from the second memory to the first memory based on the position of the pointer.

19. The method of claim 15, further comprising:
generating a plurality of memory addresses for a memory portion of the first memory to be tested;
generating a plurality of data values for the memory test; and
comparing a plurality of values read from the first memory portion to the plurality of generated data values.

20. The method of claim 15, wherein the second memory is a memory block embedded in the IC.

\* \* \* \* \*